US009335368B1

(12) United States Patent
Pantisano et al.

(10) Patent No.: US 9,335,368 B1
(45) Date of Patent: May 10, 2016

(54) METHOD AND APPARATUS FOR QUANTIFYING DEFECTS DUE TO THROUGH SILICON VIAS IN INTEGRATED CIRCUITS

(71) Applicant: GLOBALFOUNDRIES Inc., Grand Cayman (KY)

(72) Inventors: Luigi Pantisano, Saratoga Springs, NY (US); Premachandran Chirayarikathuveedu, Clifton Park, NY (US); Rakesh Ranjan, Mechanicsville, NY (US); Anil Kumar, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/525,596

(22) Filed: Oct. 28, 2014

(51) Int. Cl.
*G01R 31/28* (2006.01)
*H05K 1/02* (2006.01)
*H05K 1/03* (2006.01)
*H05K 1/11* (2006.01)
*H05K 1/18* (2006.01)
*H05K 3/40* (2006.01)
*G01R 31/26* (2014.01)

(52) U.S. Cl.
CPC ........ *G01R 31/2851* (2013.01); *G01R 31/2601* (2013.01); *H05K 1/0212* (2013.01); *H05K 1/032* (2013.01); *H05K 1/115* (2013.01); *H05K 1/185* (2013.01); *H05K 3/4038* (2013.01); *H05K 2201/10174* (2013.01); *H05K 2203/1105* (2013.01)

(58) Field of Classification Search
CPC ........... G01R 31/2851; G01R 31/2601; H05K 3/4038; H05K 1/0212; H05K 1/115; H05K 1/185; H05K 1/032; H05K 2203/1105; H05K 2201/10174
See application file for complete search history.

(56) References Cited

U.S. PATENT DOCUMENTS

2012/0153280 A1* 6/2012 Kim et al. ................ 257/48
2012/0249176 A1* 10/2012 Chien et al. ............. 324/756.02
2014/0376324 A1* 12/2014 Vogelsang et al. ....... 365/230.06

* cited by examiner

*Primary Examiner* — Michelle Mandala
(74) *Attorney, Agent, or Firm* — Ditthavong & Steiner, P.C.

(57) ABSTRACT

A device and method to control the heating of an IC chip in a wafer form for measuring various parameters associated therewith are provided. Embodiments include a device having a silicon layer with an upper surface, and on a plastic carrier; a plurality of devices in the silicon layer and electrically coupled through the upper surface to a test control system; a through silicon via (TSV) extending into the silicon layer; and a parallel heating structure adjacent to the plurality of devices electrically coupled to the test control system.

19 Claims, 4 Drawing Sheets

Background

Background

METHOD AND APPARATUS FOR QUANTIFYING DEFECTS DUE TO THROUGH SILICON VIAS IN INTEGRATED CIRCUITS

TECHNICAL FIELD

The present disclosure demonstrates a novel technique to measure various parameters in integrated circuits and particularly to quantify defects due to through silicon vias (TSVs). This disclosure works for all CMOS nodes, like for example 20 nanometer (nm), 14 nm technology nodes and beyond.

BACKGROUND

Generally, a plurality of devices (e.g., transistors, diodes, etc.) are designed and embedded into an integrated circuit (IC) chip/die, which may be placed into a package (e.g., plastic casing) or used as a bare die for placement onto a printed circuit board (PCB) of an electronic device. However, due to limited space availability on the PCBs, manufacturers of the IC chips are integrating multiple IC chips into a single vertical three-dimensional (3D) IC chip stacks, which require a much smaller footprint on a PCB. For example, a 3D IC chip stack may include several logic, memory, analog, or similar IC chips that may be connected to each other by using of TSV architecture. Typically, TSVs are vertical vias etched in a silicon layer and filled with a conducting material (e.g., copper), which provides connectivity for communication signals and voltage supply between the vertically stacked IC chips. Adoption of 3D IC chip stacking is increasingly being viewed as an alternative or addition to traditional technology node scaling at the transistor level, which may provide solutions to meet performance, power, and bandwidth requirements of various electronic devices.

FIGS. 1A and 1B schematically illustrate example of IC chip structure including a plurality of TSVs. FIG. 1A illustrates an example of 3D IC chip stack 100 that includes IC chips 101, 103, and 105. These chips are "sandwiched" and interconnected by interconnection layers 107 (e.g., including micro-bumps) to form a vertical stack, which is connected to a package substrate 109. As illustrated, the IC chips 101 and 103 may include a front metal layer 111 and a back metal layer 113, but the IC chip 105 includes only a front metal layer 111, wherein each of the metal layers 111 and 113 may represent a plurality of metal layers M-1 through M-n. Additionally, the IC chips 101, 103, and 105 include a device layer 115 and a silicon layer 117. FIG. 1B illustrates the single IC chip 101, which still includes the plurality of TSVs 119. In various scenarios, the TSVs may be implemented by use of different IC manufacturing processes; however, implementation of TSVs in 3D IC chip stacks, as well as in a single IC chip, can cause defects in the IC chip stack or in the single IC chip. For instance, implementation of the TSVs may introduce defects affecting the electrical performance of components/devices embedded in an IC chip, or the TSVs may impact the reliability of an IC chip stack. For the sake of an example, fully processed wafers with chips manufactured on top are lapped and their thickness reduced down to few microns. In some other instances, the defects may be due to a back-end-of-line (BEOL) process where an IC chip stack is formed or due to mounting of an IC chip wafer (e.g., including a plurality of IC chips) onto a plastic substrate. To quantify possible defects, various parameters at an IC chip may be measured and characterized while the IC chip wafer is cycled through different temperatures and defects may be more visible in a specific temperature range. However, increasing the temperature of an entire chip wafer may be time consuming, and the plastic substrate/film of a thinned IC chip wafer (e.g., 50 micrometer) may not be able to withstand higher temperatures (e.g., more than 50° Celsius (C)) of a test environment.

Therefore, a methodology and circuitry enabling both the defects detection due to TSVs processing damage as well as measuring various parameters associated with an IC chip on a plastic carrier is highly needed.

SUMMARY

An aspect of the present disclosure is the implementation of a circuit to control the heating of an IC chip. The circuit being integrated into the IC chip at wafer level for measuring various parameters associated therewith.

Another aspect of the present disclosure is the establishment of a method for the implementation of a circuit to control the heating of an IC chip, the circuit being integrated into the IC chip at wafer level for measuring various parameters associated therewith.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a silicon layer having an upper surface, and on a plastic carrier, a plurality of devices in the silicon layer and electrically coupled through the upper surface to a test control system, a TSV extending into the silicon layer; and a parallel heating structure adjacent to the plurality of devices electrically coupled to the test control system. Some aspects further include a device where the parallel heating structure includes a plurality of heating elements arranged in parallel. Further aspects include a device where the heating elements are formed in a metal layer of a plurality of metal layers over the first silicon layer.

Other aspects include a plurality of control elements each electrically coupled to a different one of the devices and to the test control system. In another aspect the test control system includes a multiplexing controller unit and a plurality of voltage and current sources. In a further aspect, the test control system is capable of measuring current transfer through each of the plurality of devices. In addition, the test control system is capable in varying and controlling a temperature level at each of the plurality of heating elements. In one aspect, the plurality of devices includes diodes.

In some aspects of the present disclosure, the proposed method has several advantages, including a precise detection capability of a current transfer through a plurality of devices in a semiconductor IC chip on a plastic carrier, localized variation and control capacity of a temperature level in the semiconductor IC chip, and able to detect even a small change in the current transfer at the varied temperature level. In another aspect, the varying of the temperature is effectuated via a parallel heating structure including a plurality of heating elements arranged in parallel. In some aspects, the heating elements are in a metal layer of a plurality of metal layers in the semiconductor IC chip. In one aspect, the method includes controlled increase of the local temperature of the semiconductor IC chip in a range of about 25° C. to about 300° C.

In a further aspect, the method includes electrically coupling of each of a plurality of control elements to a different one of the devices and to a test control system. In some aspects, the method includes addressing the plurality of devices, via the test control system, and by a coding scheme including row and column indicators associated with each of the devices. In one aspect, the plurality of devices includes diodes.

In other aspects of the present disclosure, the method includes providing a silicon layer having an upper surface, and on a plastic carrier, providing a plurality of devices in the silicon layer, electrically coupling the devices through the upper surface to a test control system, providing a TSV extending into the silicon layer, arranging heating elements in parallel in one or more metal layers, the heating elements being adjacent to the plurality of devices, electrically coupling of the heating elements to the test control system, detecting a current transfer through the plurality of devices, locally varying a temperature level of the plurality of devices, and detecting a change in the current transfer at the varied temperature level.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the inability problem of a plastic carrier to withstand the high temperatures needed to detect potential defects in any IC chip during a wafer level testing of, for example thinned wafers, where these defects may be due to TSVs used for connecting a plurality of IC chips to each other. The present disclosure addresses and solves such problems, for instance, by, inter alia, measuring various parameters at the IC chip while locally varying and controlling the temperature at a plurality of devices at the IC chip.

Figure 1A:
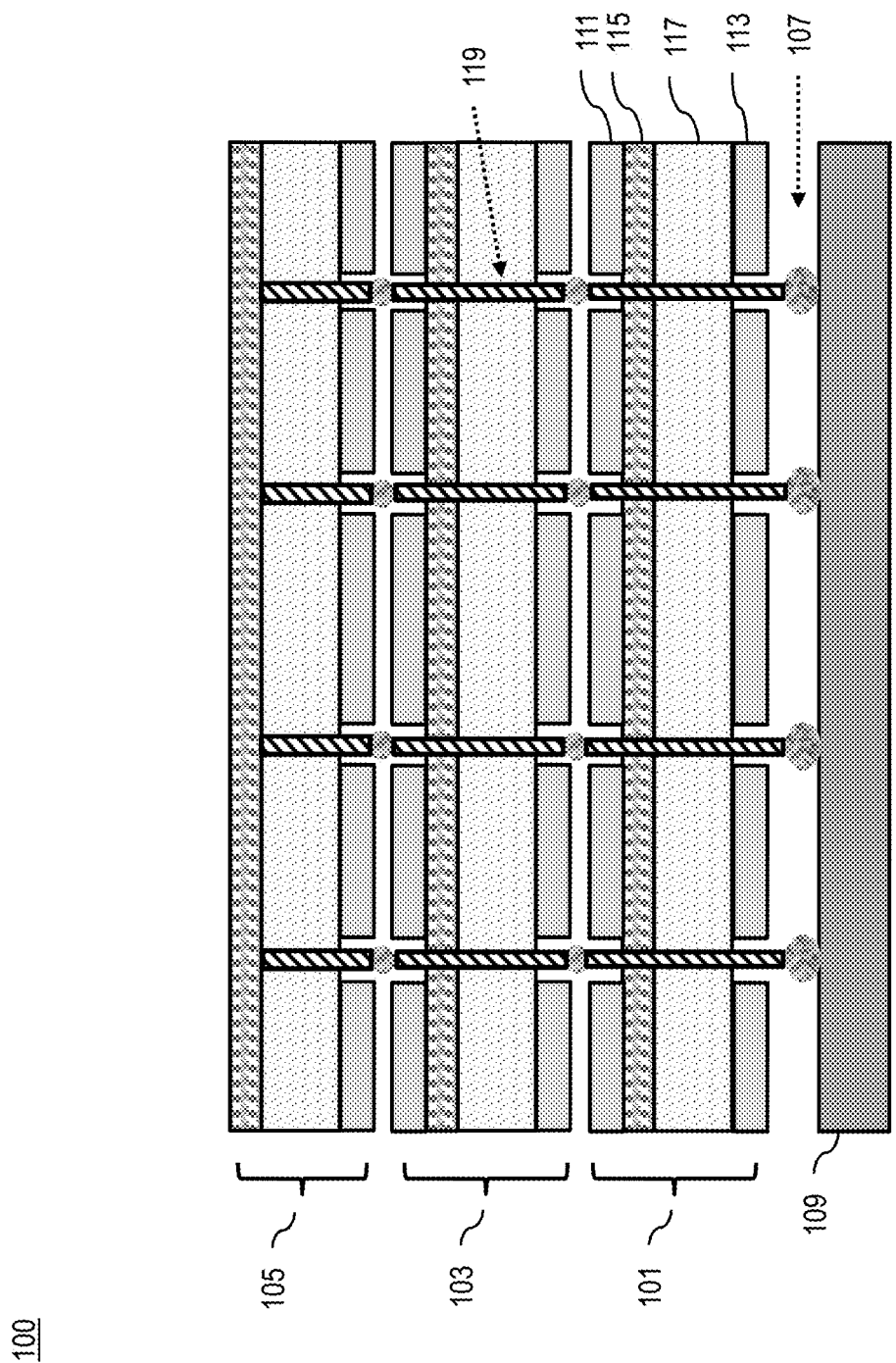
FIGS. 1A and 1B schematically illustrate example of IC chip structures including a plurality of TSVs.
Figure 1B:
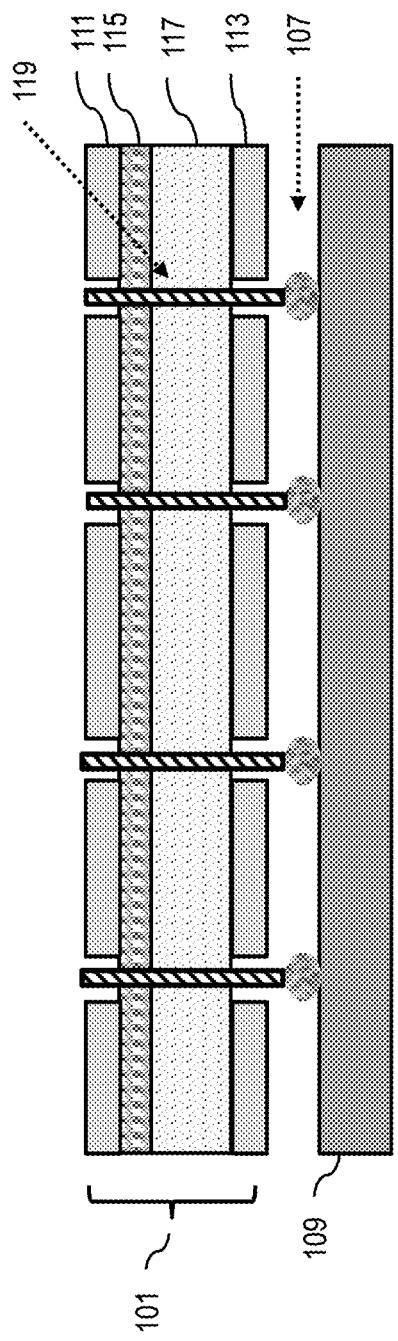
Figure 2:
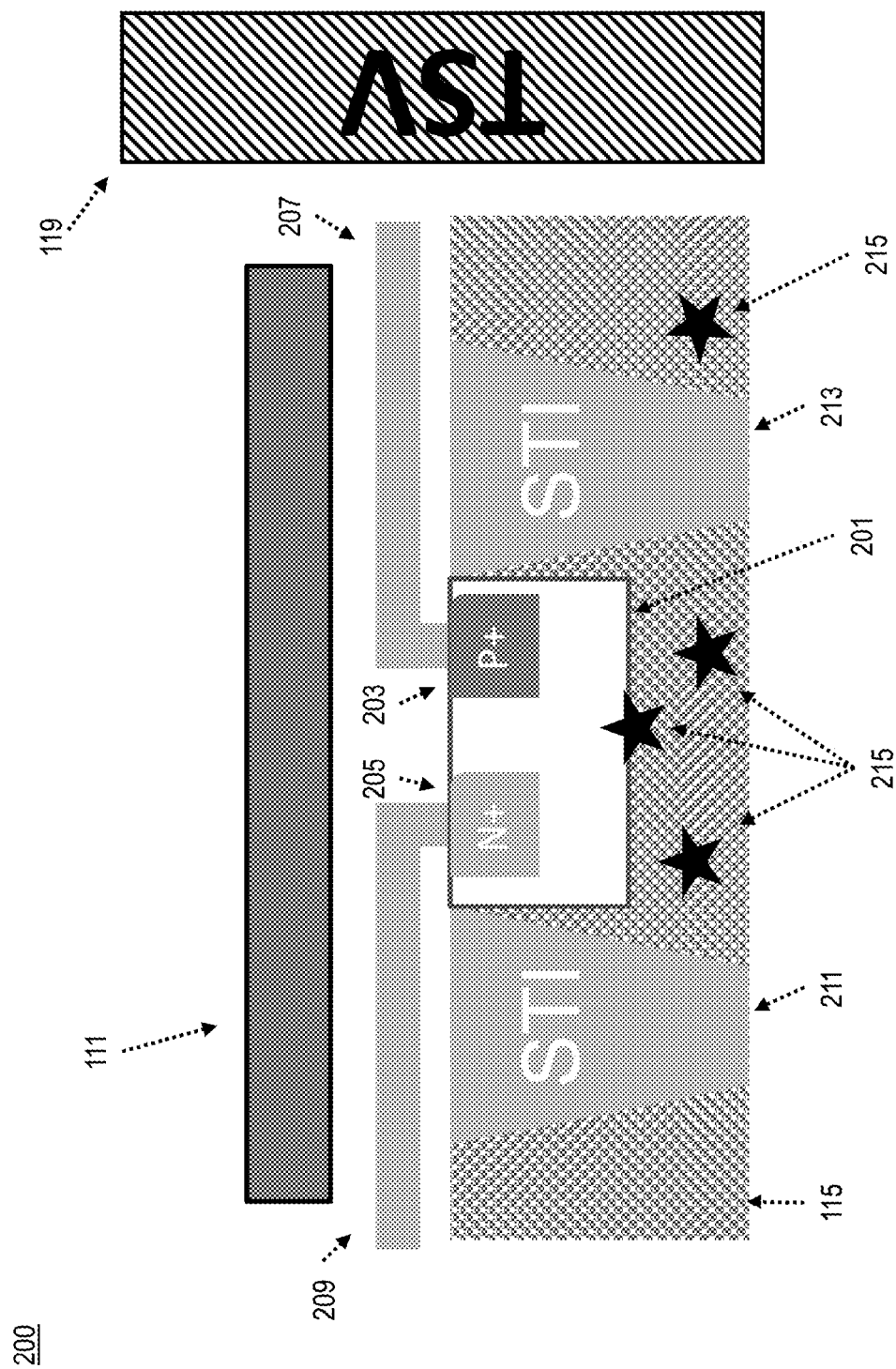
FIG. 2 illustrates a block diagram of a device and a TSV in an IC chip, in accordance with an exemplary embodiment.

FIG. 2 illustrates a block diagram of a device, a TSV, and a heating element in an IC chip, in accordance with an exemplary embodiment. Diagram 200 includes an electronic device 201 (e.g., a diode, transistor, capacitor, etc.) in a semiconductor layer 115, where the device 201, a diode for example, has a P+ contact 203 and an N+ contact 205, which are further connected to their respective electrical contacts 207 and 209, for example, at a metal-1 (M-1) layer. Further, the semiconductor layer 115 includes shallow trench isolation (STI) regions 211 and 213 that are to prevent electrical leakage current (Ampere=I) between adjacent devices (e.g., the device 201 and another device) on the same semiconductor layer 115. Furthermore, the diagram 200 depicts a TSV 119 that is formed and extends into the semiconductor layer 115, where the TSV may be extended through the semiconductor layer 115 to provide connectivity from/to other substrate layers above or below the device 201. For example, the TSV 119 may be used to provide signaling connections between a microprocessor IC chip that may be below the semiconductor layer 115 and a memory IC chip that may above the semiconductor layer 115. Additionally, the diagram 200 depicts a metal layer 111, which may provide electrical connectivity among a plurality of metal layers above or below the device 201. As mentioned, to detect potential defects 215 in an IC chip, the IC chip may be tested at different temperatures (e.g., 25 to 300° C.) during a front-end-of-line (FEOL) process where various functional tests (e.g., transistor characteristics) on an IC chip may be performed. In some instances, latent defects in an IC chip may become active or present higher levels of malfunction at higher temperature levels. Additionally, the tests may include conditions to reflect variations in the manufacturing process (e.g., process corners) as well as an operating voltage range for the IC chip. For example, a diode-like device may be utilized to study defects in an IC chip since a diode can simulate functional characteristics of a metal-oxide-semiconductor field-effect transistor (MOSFET) device under similar conditions. Specifically, the current conduction mechanism in a diode is limited by electron-hole recombination, such that in the presence of a bulk defect (e.g., defects 215), the current conduction would increase. Furthermore, the defects would be easier to detect as the temperature of each IC chip is increased (e.g., 50 to 125° C.) by controlling its respective heating element that, for example, may be in a metal-2 (M-2) layer.

In the reliability field of negative bias temperature instability, where defects are generated in PMOS devices at high electric field and high temperature (e.g., 125° C.), solutions including use of local heaters have been demonstrated. In some instances, local-heater solutions involving diode junctions or resistor-like structures at interconnect level have been demonstrated. In one example, BEOL metallization, commonly used as local interconnect for devices and circuits, is used as the local heater. In this case a local resistor-like heater is interconnected on top of the devices or circuits of interest thus being able to optimally heat any device under test even in presence of poorly conductive FINFET architectures. Additionally, it is noted that these interconnect lines are typically capable to sustain heating power (e.g., a milliwatt) needed to bring local temperature into the desired levels without suffering themselves reliability issues (e.g., electromigration) as well as being robust against process-induced damage by a TSV itself, (local cracks, flexibility, etc.)

Figure 3:
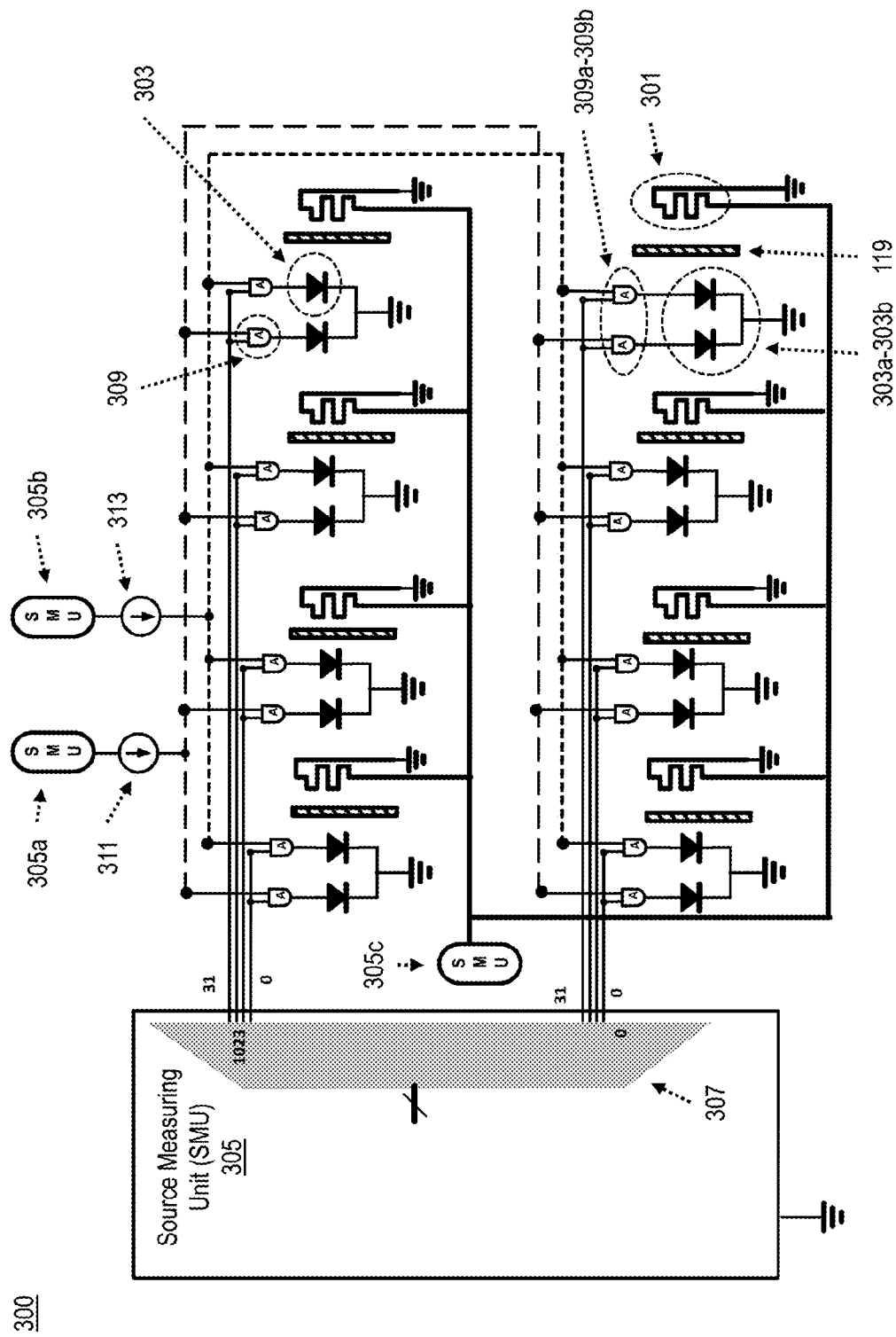
FIG. 3 schematically illustrates a circuit for testing an IC chip, in accordance with an exemplary embodiment.

FIG. 3 schematically illustrates a circuit for testing an IC chip, in accordance with an exemplary embodiment. In FIG.

3, circuit 300 includes a plurality of TSVs 119, heating elements 301 (e.g., in the front metal layer 111), and devices (e.g., diodes) 303, wherein the heating elements 301 and the devices 303 are electrically coupled to a source measure unit (SMU) device 305. In some instances, a plurality of SMUs 305, 305a, 305b, 305c, or the like, may be utilized to perform various functions, e.g., provide/measure current or voltage, control/measure temperatures, etc., for a testing of the devices 303. Typically, an SMU is a versatile device that can be utilized to provide and control precise levels of voltage or current to an electronic device and simultaneously measure voltage or current at that device. The SMU device 305 can be used together with a multiplexer 307 for providing control signals to the devices 303 via control elements 309 (e.g., "AND" gates), respectively. Importantly, this solution enables the fast collection of a large sample statistics for a proper assessment of process variability and process damage induced by, for example, TSV processing or similar. Additionally, the SMU devices 305a and 305b include current sources 311 and 313 to provide current to the devices 303 via the control elements 309. In one example, the current sources 311 and 313 can provide two different currents of a known ratio to control elements 309a and 309b, respectively, where the SMU device 305, 305a, or 305b can measure voltages developed across devices 303a and 303b and use those voltages to calculate respective temperatures across the devices 303a and 303b. Furthermore, the heating elements 301 are also coupled to the SMU device 305. In one example, to determine statistical measurement data, the SMU device 305c can cause an increase in the temperature of the multiple devices 303 via their respective heating elements 301 while the devices can be addressed by the SMU device 305 in a memory-like coding with row/column indicators associated with each device 303. In this example the circuit 300 includes a 32×32 matrix of TSVs and devices 303 that can be addressed by the multiplexer 307. It is noted that in addition to characterizing diodes in an IC chip, the circuit 300 may be utilized in a similar fashion to test or characterize MOSFETs, ring oscillators, or the like devices where TSV architecture is utilized.

Advantages of the design of FIG. 3 include fast detection of defects and reliability issues in an IC chip that is utilizing TSV architecture in a statistically sound method, wherein a plurality of IC chips may be tested/characterized with different device geometries and manufacturing/fabrication process corners.

The embodiments of the present disclosure can achieve several technical effects, including improved detection of defects and reliability issues in an IC chip that is utilizing TSV architecture. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM memory cells (e.g., liquid crystal display (LCD) drivers, synchronous random access memories (SRAM), digital processors, etc.)

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a silicon layer having an upper surface, and on a plastic carrier;
   a plurality of devices in the silicon layer and electrically coupled through the upper surface to a test control system;
   a through silicon via (TSV) extending into the silicon layer; and
   a plurality of parallel heating structures, each one of the plurality of heating structures individually controlled and adjacent to one of the plurality of devices electrically coupled to the test control system.

2. The device according to claim 1, wherein the parallel heating structure comprises a plurality of heating elements arranged in parallel.

3. The device according to claim 2, wherein the heating elements are formed in a metal layer of a plurality of metal layers over the silicon layer.

4. The device according to claim 1, further comprises:
   a plurality of control elements each electrically coupled to a different one of the devices and to the test control system.

5. The device according to claim 1, wherein the test control system comprises:
   a multiplexing controller unit; and
   a plurality of voltage and current sources.

6. The device according to claim 1, wherein the test control system is capable of measuring current transfer through each of the plurality of devices.

7. The device according to claim 1, wherein the test control system is capable of varying a temperature level at each of the plurality of heating elements.

8. The device according to claim 1, wherein the plurality of devices includes diodes.

9. A method comprising:
   detecting a current transfer through a plurality of devices in a semiconductor integrated circuit (IC) chip on a plastic carrier;
   locally varying a temperature level of the semiconductor IC chip; and
   detecting a change in the current transfer at the varied temperature level,
   wherein the varying of the temperature is effectuated via a plurality of parallel heating structures individually controlled, including a plurality of heating elements arranged in parallel, each of the plurality of heating elements corresponding to one of the plurality of devices.

10. The method according to claim 9, wherein the heating elements are in a metal layer of a plurality of metal layers in the semiconductor IC chip.

11. The method according to claim 9, further comprising:
    increasing the temperature level of the semiconductor IC chip in a range of about 25° Celsius (C) to about 300° C.

12. The method according to claim 9, further comprising:
    electrically coupling of each of a plurality of control elements to a different one of the devices and to a test control system.

13. The method according to claim 12, further comprising:
addressing the plurality of devices, via the test control system, by a coding scheme including row and column indicators associated with each of the devices.

14. The method according to claim 9, wherein the plurality of devices includes diodes.

15. A method comprising:
providing a silicon layer having an upper surface, and on a plastic carrier;
providing a plurality of devices in the silicon layer;
electrically coupling the devices through the upper surface to a test control system;
providing a through silicon via (TSV) extending into the silicon layer;
arranging a plurality of heating elements in parallel in one or more metal layers, each one of the plurality of heating elements being adjacent, and individually controlled, and corresponding, to each of the plurality of devices;
electrically coupling the heating elements to the test control system;
detecting a current transfer through the plurality of devices;
locally varying a temperature level of the plurality of devices; and
detecting a change in the current transfer at the varied temperature level.

16. The method according to claim 15, further comprising:
increasing the temperature level in a range of about 25° Celsius (C) to about 300° C.

17. The method according to claim 15, further comprising:
addressing the plurality of devices, via the test control system, by a coding scheme including row and column indicators associated with each of the devices.

18. The method according to claim 15, wherein the devices are diodes.

19. The method according to claim 15, wherein the test control system comprises:
a multiplexing controller unit; and
a plurality of voltage and current sources.

* * * * *